US012765332B2

(12) United States Patent
Roy et al.

(10) Patent No.: US 12,765,332 B2
(45) Date of Patent: Oct. 13, 2026

(54) USE OF TIN THIN FILM FOR BONDING AND AS MASKING FILM

(71) Applicant: University of South-Eastern Norway, Kongsberg (NO)

(72) Inventors: Avisek Roy, Horten (NO); Eivind Bardalen, Nykirke (NO); Per Alfred Øhlckers, Nesbru (NO)

(73) Assignee: University of South-Eastern Norway, Borre (NO)

( * ) Notice: Subject to any disclaimer, the term of this patent is extended or adjusted under 35 U.S.C. 154(b) by 302 days.

(21) Appl. No.: 18/572,450

(22) PCT Filed: Jun. 30, 2022

(86) PCT No.: PCT/EP2022/068101

§ 371 (c)(1),
(2) Date: Dec. 20, 2023

(87) PCT Pub. No.: WO2023/280676

PCT Pub. Date: Jan. 12, 2023

(65) Prior Publication Data

US 2025/0132158 A1 Apr. 24, 2025

(30) Foreign Application Priority Data

Jul. 7, 2021 (NO) .................................... 20210884

(51) Int. Cl.
*H10P 76/40* (2026.01)
*H10P 14/60* (2026.01)
(Continued)

(52) U.S. Cl.
CPC ........ *H10P 76/405* (2026.01); *H10P 14/6319* (2026.01); *H10P 50/242* (2026.01);
(Continued)

(58) Field of Classification Search
None
See application file for complete search history.

(56) References Cited

U.S. PATENT DOCUMENTS

2011/0089141 A1* 4/2011 Tanaka ................ B81C 1/00103 216/47
2017/0225947 A1 8/2017 Chen et al.
2021/0202249 A1 7/2021 Church et al.

FOREIGN PATENT DOCUMENTS

KR 20160146126 A 12/2016

OTHER PUBLICATIONS

Aasmundtveit, Knut E. et al., "Solid-Liquid Interdiffusion (SLID) Bonding—Intermetallic Bonding for High Temperature Applications," In Proceedings of the 2013 European Microelectronics Packaging Conference (EMPC), Grenoble, France, Sep. 9-12, 2013, pp. 1-6.

(Continued)

*Primary Examiner* — Stephanie P Duclair
(74) *Attorney, Agent, or Firm* — Bradley Arant Boult Cummings LLP

(57) ABSTRACT

The present invention relates to a method for micromachining a silicon structure especially for SLID bonding, comprising the steps of preparing a silicon wafer with a metal pattern on said silicon, said silicon being exposed outside said pattern, the metal pattern at least having an upper surface consisting of Sn. The method comprising a step of DRIE etching of the structure for etching cavities in said exposed silicon wafer essentially without etching said Sn top layer. The method also relates to the use of Sn as an etching mask in micromachining av silicon structures.

8 Claims, 9 Drawing Sheets

(51) Int. Cl.
*H10P 50/24* (2026.01)
*H10P 50/64* (2026.01)
*H10P 90/00* (2026.01)

(52) U.S. Cl.
CPC .......... *H10P 76/4085* (2026.01); *H10P 90/00* (2026.01); *H10P 50/642* (2026.01)

(56) References Cited

OTHER PUBLICATIONS

Hilton, Allan et al., "Wafer-Level Vacuum Packaging of Microbolometer-Based Infrared Imagers," In Proceedings of the International Wafer-Level Packaging Conference, Oct. 2016, San Jose, CA, USA, 6 pages.

Kuo, Tzu-Ying et al., "Reliability tests for a three dimensional chip stacking structure with through silicon via connections and low cost," 58th Electronic Components and Technology Conference, May 27-30, 2008, Lake Buena Vista, FL, USA, IEEE, pp. 853-858.

Lapadatu, Adriana et al., "Cu—Sn Wafer Level Bonding for Vacuum Encapsulation of Microbolometer Focal Plane Arrays," The Electrochemical Society, 2010 ECS Transactions, vol. 33, No. 4, 2010, pp. 73-82.

Larsson, Andreas et al., "Ni—Sn solid liquid interdiffusion (SLID) bonding—Process, bond characteristics and strength," In Proceedings of the 2016 6th Electronic System-Integration Technology Conference (ESTC), Grenoble, France, IEEE, Sep. 13-15, 2016, pp. 1-6.

Laurila, T. et al., "Interfacial reactions between lead-free solders and common base materials," Materials Science and Engineering R Reports, vol. 49, Mar. 2005, pp. 1-60.

Luu, Thi-Thuy et al., "High-Temperature Mechanical Integrity of Cu—Sn SLID Wafer-Level Bonds," Metallurgical and Materials Transactions A, Jul. 2015, vol. 46, pp. 5266-5274.

Luu, Thi Thuy et al., "Cu/Sn SLID wafer-level bonding optimization," Proceedings of the 27th Electronic Components Conference 2013 IEEE 63rd Electronic Components and Technology Conference, Institute of Electrical and Electronics Engineers, May 28-31, 2013, pp. 1531-1537.

Patent Cooperation Treaty, International Application No. PCT/EP2022/068101, "International Search Report," Oct. 19, 2022, 2 pages.

Wang, Xiaojing et al., "Wafer-Level Vacuum Sealing by Transfer Bonding of Silicon Caps for Small Footprint and Ultra-Thin MEMS Packages," Journal of Microelectromechanical Systems, vol. 28, Issue 3, Jun. 2019, IEEE, pp. 460-471.

Xu, H. et al., "Wafer-level SLID bonding for MEMS encapsulation," Advances in Manufacturing, Sep. 2013, vol. 1, pp. 226-235.

* cited by examiner

Atomic percent (%)

| Spectrum | O | Cu | Sn |
|---|---|---|---|
| Point 16 | 3.76 | 2.61 | 93.63 |
| Point 17 | 7.29 | 1.38 | 91.33 |
| Point 18 | 2.09 | 2.69 | 95.22 |
| Point 19 | 8.98 | 2.14 | 88.87 |

Atomic percent (%)

| Spectrum | C | O | Si | Ti | Cu | Sn |
|---|---|---|---|---|---|---|
| Point 34 | 6.04 | 35.61 | 57.45 | 0.91 | - | - |
| Point 35 | 6.85 | 35.51 | 56.80 | 0.83 | - | - |
| Point 36 | 7.39 | 7.59 | - | - | 3.05 | 81.96 |
| Point 37 | 7.97 | 7.62 | - | - | 3.16 | 81.25 |

Atomic percent (%)

| Spectrum | Si | Cu | Sn |
|---|---|---|---|
| Point 6 | - | 1.15 | 98.85 |
| Point 7 | - | 0.45 | 99.55 |
| Point 8 | 100.00 | - | - |

Atomic percent (%)

| Spectrum | Si | Cu | Sn |
|---|---|---|---|
| Point 12 | - | 4.58 | 95.42 |
| Point 13 | - | 3.66 | 96.34 |
| Point 14 | - | 6.71 | 93.29 |
| Point 15 | 100.00 | - | - |

USE OF TIN THIN FILM FOR BONDING AND AS MASKING FILM

FIELD OF THE INVENTION

The present invention generally relates to the field of silicon chip and wafer-level packaging (CLP and WLP) of silicon microsystems including MicroElectromechanical Systems (MEMS) having silicon micromachined structures such as cavities. The CLP and WLP are done by Solid-Liquid-InterDiffusion (SLID) bonding and the structure or cavity etching is done by dry etching such as Deep Reactive Ion Etching or wet etching by anisotropic wet etching. The present invention relates to the use of tin (Sn) as the surface metal layer used both as a part of the metal layers used in the SLID bonding and also used as the etching mask film during silicon micromachining.

BACKGROUND OF THE INVENTION

Microsystems devices including MEMS devices are widely used, having sensor and/or actuating functionality, often combined with microelectronics and using microelectronic fabrication technologies to achieve high performance at low cost. Examples of such successful devices include MEMS pressure sensor, accelerometer, gyroscope, microbolometer, RF switch, etc. Bosch, Honeywell, IMEC, Infineon, MEMSCAP, Philips, Semefab, Sensonor, Sony, STMicroelectronics, Tronics, TSMC, Xfab are some of the leading companies that commercially produce such microsystems. MEMS devices are often encapsulated for mechanical, electrical and/or chemical protection of the sensitive and vulnerable microstructures. Some devices also require vacuum encapsulation with hermetic sealing for ensuring proper functionality of the sensors. The encapsulation is mostly done by sealing the microsystem with a cap/lid in chip or wafer level (FIG. 1). There are numerous bonding methods for encapsulating the MEMS device with the cap including SLID bonding [1-3], where metal layers are used for bonding of the two chips/wafers.

The chips are bonded together as chips (CLP) or on wafer-level (WLP) for each actual product, depending on specific preferences on technical capability and cost consideration, with WLP packaging preferred for high volume products justifying higher NonRecurring Engineering (NRE) costs. Apart from low packaging cost, WLP also reduces testing and burn-in costs while providing high throughput. SLID bonding process can be used in both chip and wafer-level packaging, while it can provide hermetic sealing at relatively low temperatures. In SLID, Sn is a commonly used material due to its low melting temperature (~232° C.). During the metal deposition for sealing frames, Sn layer is often stacked on top of Cu, Au, Ag, Ni or Cu—Ni [3-6].

In US 2017225947 [9] a conventional method is described using a photoresist over the Sn layer before cavity etching, while US2021202249 [10] and KR20160146126 [11] describes processing of semiconductor substrates.

SUMMARY OF THE INVENTION

The present invention provides a process for the combined use of tin (Sn) thin film as the SLID top layer metal layer and as the masking film during silicon micromachining. In this way, two separate deposition and photolithographic processes can be done as one deposition and photolithographic process reducing the needed process steps and, also give self-alignment between the silicon micromachined structure and the SLID sealing pattern. In a typical cap wafer fabrication process, the sealing metal is protected with photoresist when the cavity is formed by selective Si etching [7,8]. In the proposed fabrication method, the entire wafer is etched, except for the areas covered by the sealing metal. In this case, the exposed sealing metal layer acts as the mask for the Si cavity etching. It is therefore an object of the present invention to provide a production method with reduced cap wafer processing steps, which will increase yield and reduce the batch processing cost, resulting in lower unit cost for the finished product.

More specifically, the objects of the present invention is obtained as specified in the accompanying claims.

The invention will be described more in detail below with reference to the accompanying drawings illustrating the invention by way of examples.

Figure 1:
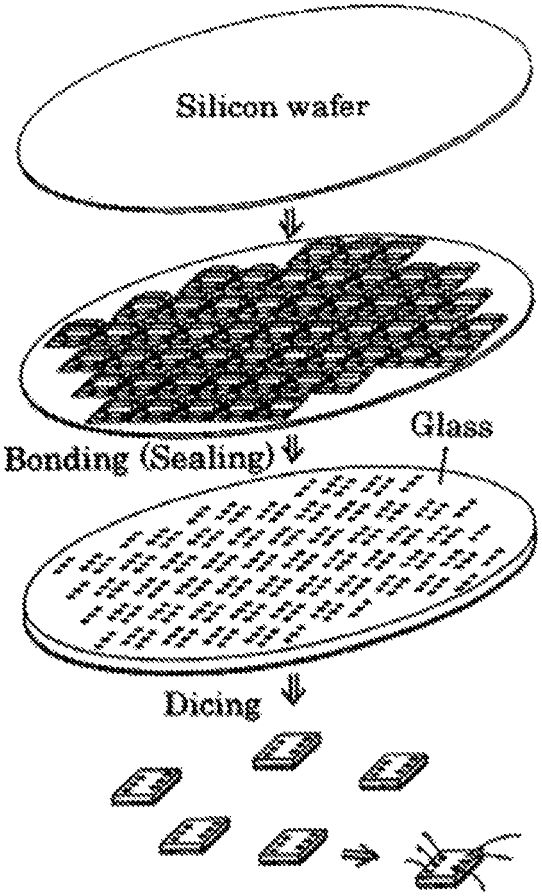
FIG. 1 illustrates the wafer packaging according to the prior art.
Figure 2:
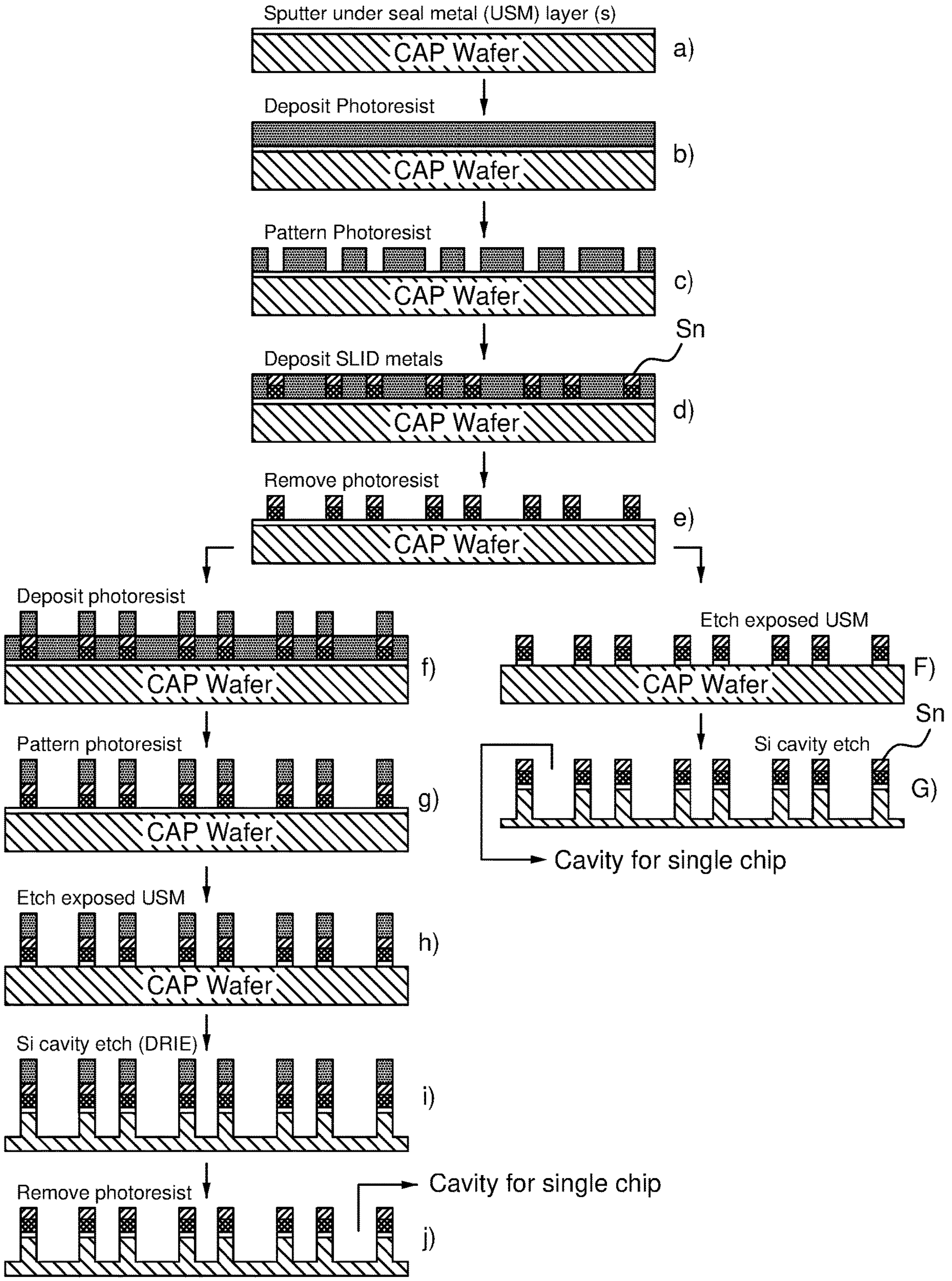
FIG. 2 illustrates the wafer processing according to one example of the prior art as well as according to the preferred embodiment of the invention.

As is illustrated in FIG. 2 the wafer is may be processed according to the following steps:

a) Depositing, e.g. by sputtering, a metal layer (under seal metal layer USM) on a silicon wafer.
b) Depositing a photoresist layer.
c) Providing a patter in said photoresist layer making recesses down to said USM in a predetermined pattern.
d) Depositing SLID metals in said recesses, e.g. with Sn in the top layer.
e) Removed said photoresist.

From this point the prior art process would continue by the steps of:

f) Depositing a new photoresist covering the SLID metal deposits.
g) Remove the photoresist between the SLID metal deposits by patterning the photoresist exposing the USM between them.
h) Etch the exposed USM.
i) Use DRIE etching for etching the silicon between the SLID metal deposits still being covered by photoresist.
j) Remove the photoresist exposing the Sn on top of the SLID metal structures.

The present invention is based on the realization that the Sn metal does not react to the etching and thus a simplified process may be used, including the steps following step e):

F) Removing the USM between the USM between the SLID metal structures.
G) Etching cavities in the silicon wafer between the SLID metal structures.

The fabrication is discussed more in detail below. Fabrication of the cap wafer starts with deposition of under seal metal (USM) layers on a silicon wafer. The USM layers can also be deposited on oxidized Si wafers to prevent metal diffusion to bulk silicon, where a thin layer of silicon dioxide (~200-500 nm) is grown by thermal oxidation. In our demonstration, Cu—Sn SLID bonding technique was chosen, where Au and TiW were used as the USM layers. A thin adhesion layer like TiW is first deposited as the adhesion layer between the Si or $SiO_2$ surface and the Au seed layer followed by the Au layer, both using sputtering.

Figure 3:
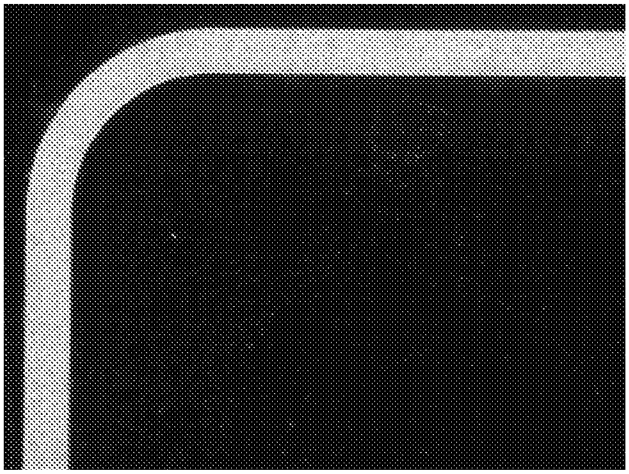
FIG. 3 illustrates a corner of a bond frame after deposition of SLID metals.

A photolithographic process is then performed to define the bond frame regions (FIG. 2). Then SLID metal layers are electroplated on the opening where Au surface is exposed. Cu is first electroplated on Au, and then Sn is electroplated on Cu. The electrodeposited Cu and Sn thickness are ~3-5 μm and ~1-3 μm, respectively. After deposition of these SLID metal layers, the photoresist is removed. One side of the bond frame is shown in FIG. 3, where the topmost layer is Sn, where FIG. 3 shows a corner of a bond frame after deposition of SLID metals.

The deposition process to prepare the bond frames on the cap wafer is part of a typical process flow as shown in FIG. 2. However, as illustrated, typical micromachining of cap wafer requires several steps, where photolithography steps are performed again to protect the top metal layer on the bond frames. In our proposed approach, we have shown micromachining of cap wafer with Sn as the etching mask, where the photolithographic steps are avoided. This approach simplifies the process while reducing both processing time and cost for the cap wafers.

Figure 4A:
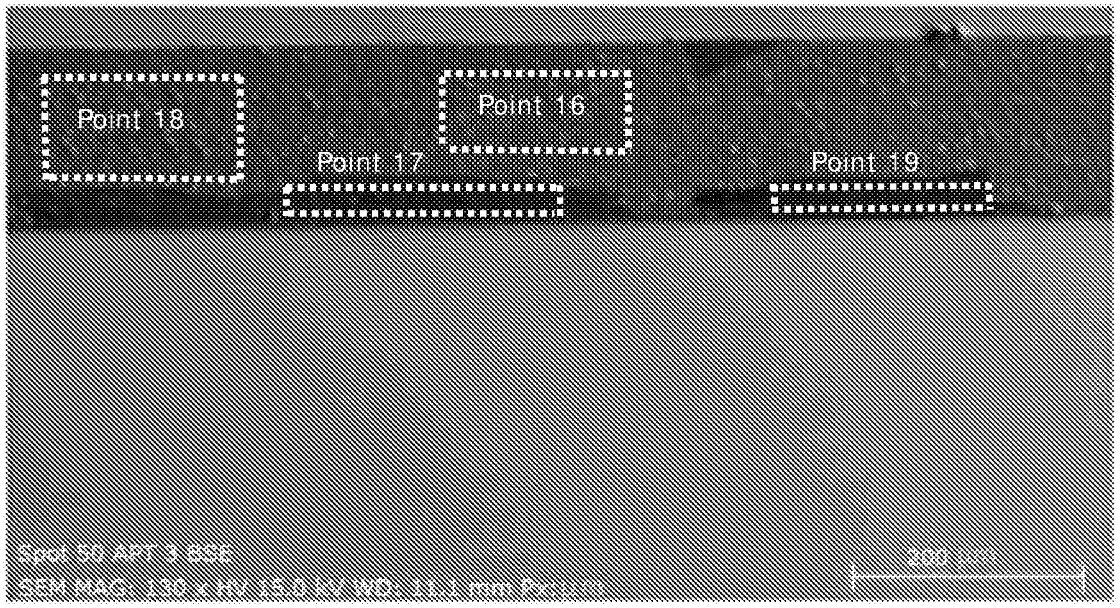
FIG. 4 illustrates an EDX analysis of bond frame (a) before and (b) after USM layer etching.

In the proposed method, steps F) and G) in FIG. 2*b*, the exposed Au and TiW layers are wet etched. Energy-dispersive X-ray spectroscopy (EDX) analysis of a bond frame is shown in FIG. 4. Before the etching of USM layers, average atomic percentage of Sn in the bond frame is over 92%. After USM layer etching, there is a reduction in Sn percentage. Most of which is due to carbon. If carbon is not taken into consideration (similar to previous analysis), then Sn % will increase. This indicates some amount of Sn etching during the process. As the Sn is not significantly etched, it will not affect the SLID bonding process. During electrodeposition, the Sn thickness can be increased accordingly to compensate for this.

The next processing step before Si cavity etching can be etching the exposed $SiO_2$ layer if oxidized Si wafer is used. In our process, oxidized Si wafers were used. Hence, $SiO_2$ layer was etched by reactive ion etching (RIE), where $CHF_3$ was used as the primary reactive gas. The final step is etching Si to form the cavity of the cap wafer. Cavity micromachining with Sn as mask is successfully demonstrated in both DRIE and wet Si etching approaches.

(a) Cavity Formation by Si DRIE

Figure 5A:
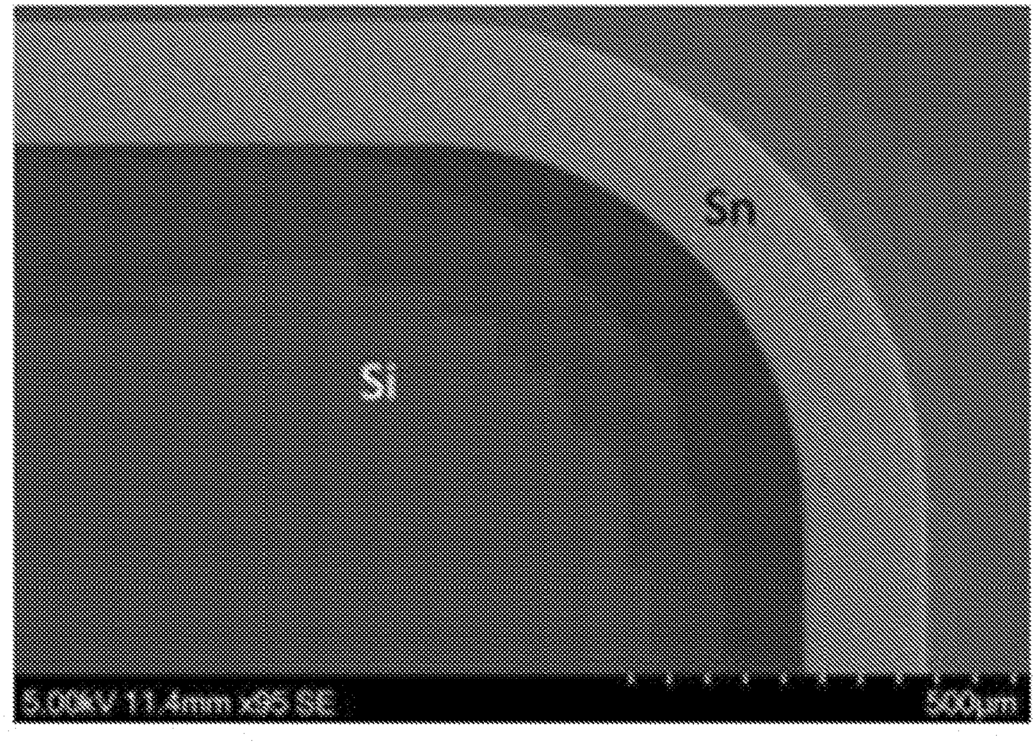
FIG. 5 illustrates cavity formation by Si DRIE—(a) etched wafer, (b) electron micrograph of the bond frame, and (c) profilometer measurement.
Figure 5B:
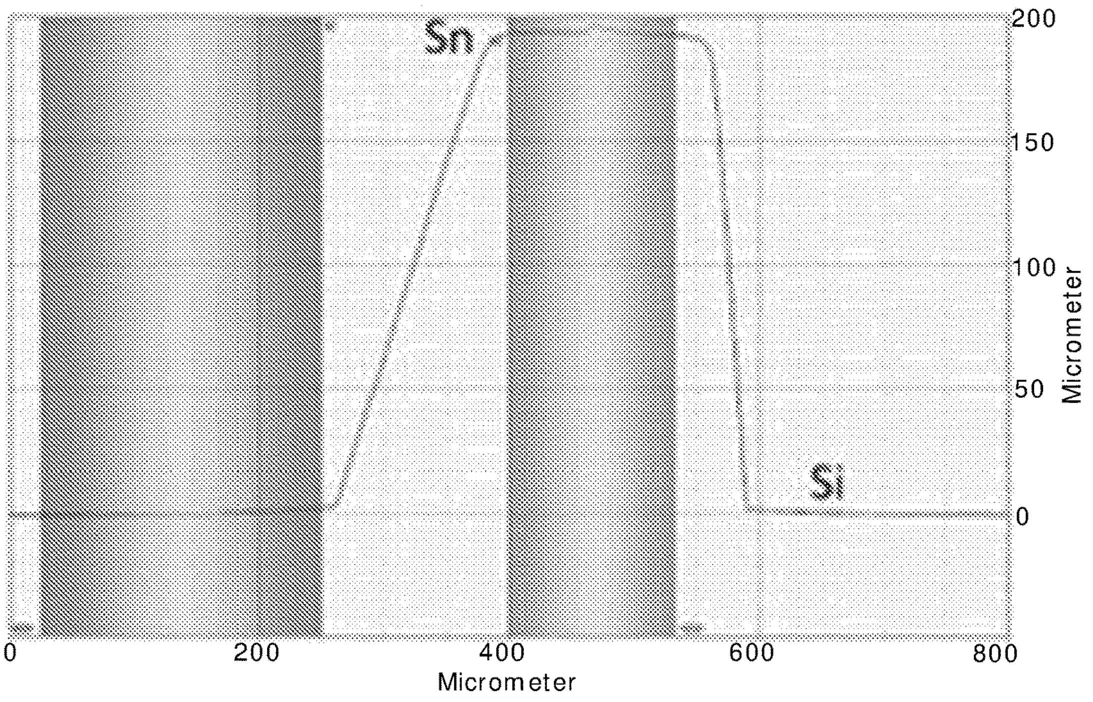

A typical Bosch DRIE technique was used for etching the bulk Si. $SF_6$ is used for the plasma etching process, where $C_4F_8$ is used for the passivation layer on the sidewalls. The Sn layer on the bond frames was exposed during the process and acted as mask for micromachining the cavity (FIG. 5). The etched cavity was ~200 μm.

Figure 4B:
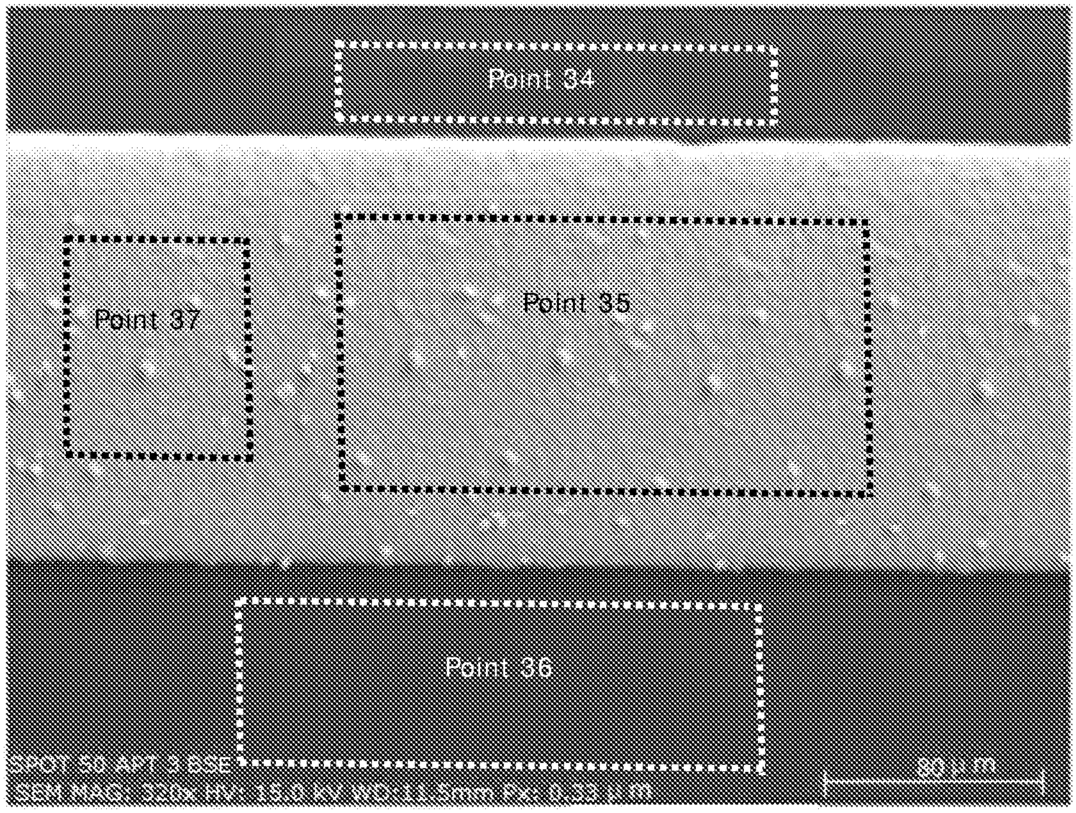

Atomic percentage of Sn remains high compared to the results obtained before the cavity etching (FIG. 4*b*). This indicates insignificant impact on the bond frame during the DRIE process. Therefore, Sn can be used as the mask for the cavity etching with Si DRIE.

(b) Cavity Formation by Si Wet Etching

Figure 6A:
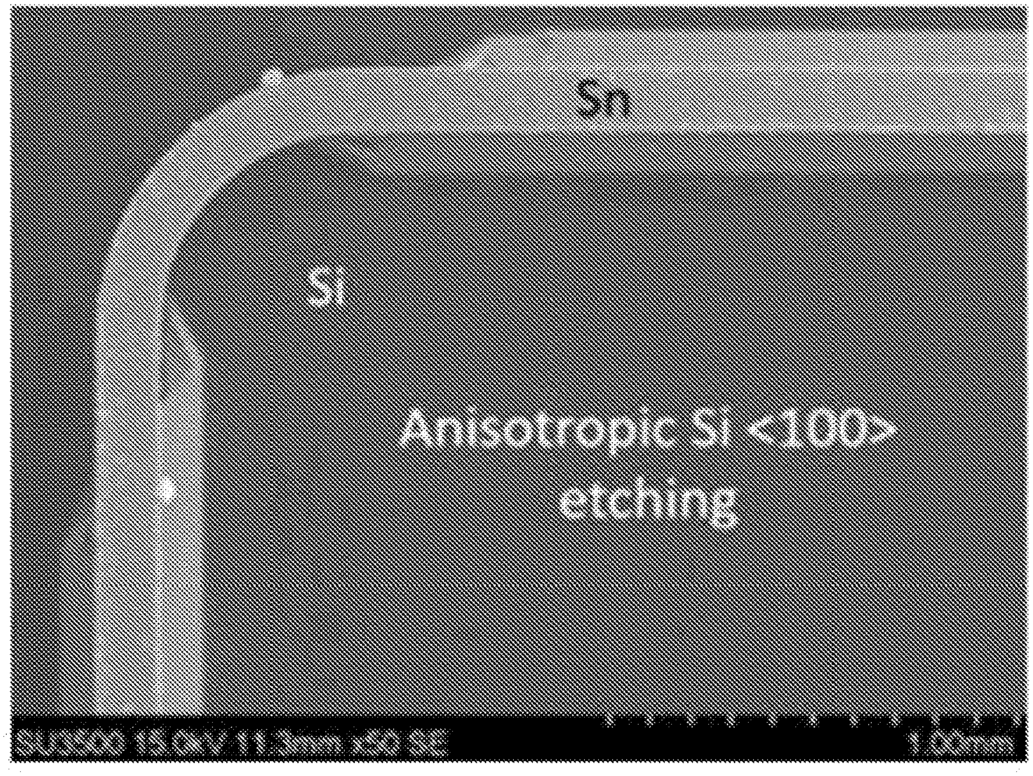
FIG. 6 illustrates cavity formation by Si wet etching—(a) etched wafer, (b) electron micrograph of the bond frame, and (c) profilometer measurement.
Figure 6B:
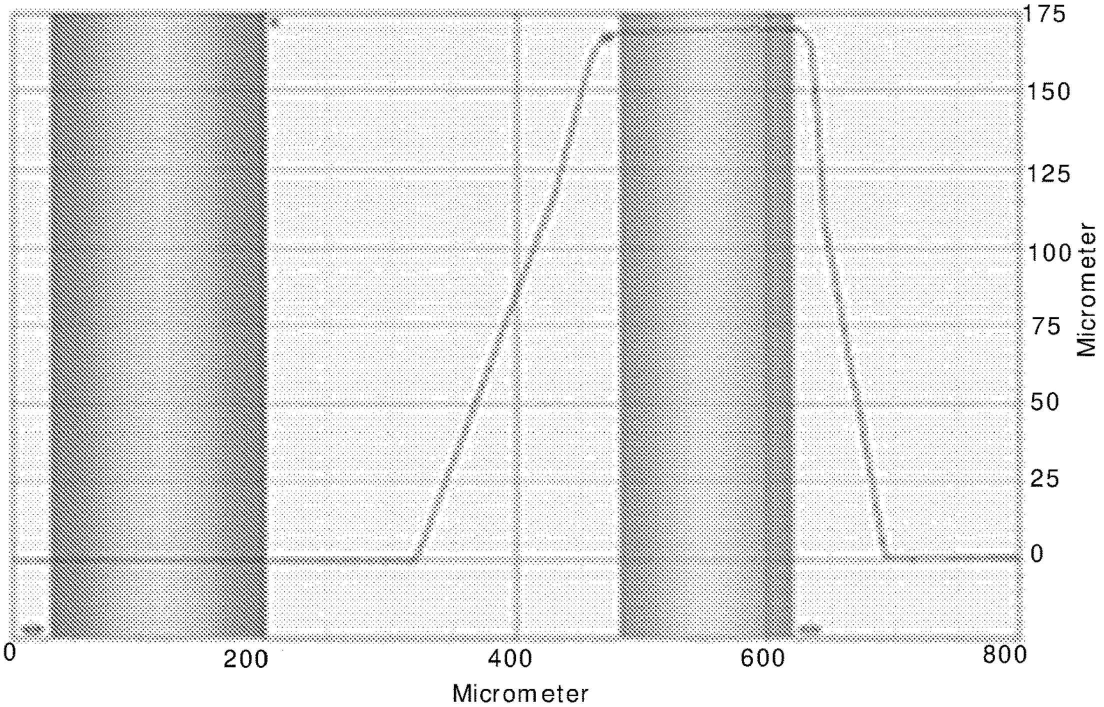

The cavity of the cap wafer was also micromachined by Si wet etching as shown in FIG. 6. The wafer was etched with 10% KOH at 80° C. which resulted in anisotropic Si etching (FIG. 6*b*). ~170 μm cavity was formed with ~1.42 μm/min etch rate. The etching was uniform across the wafer.

Figure 7A:
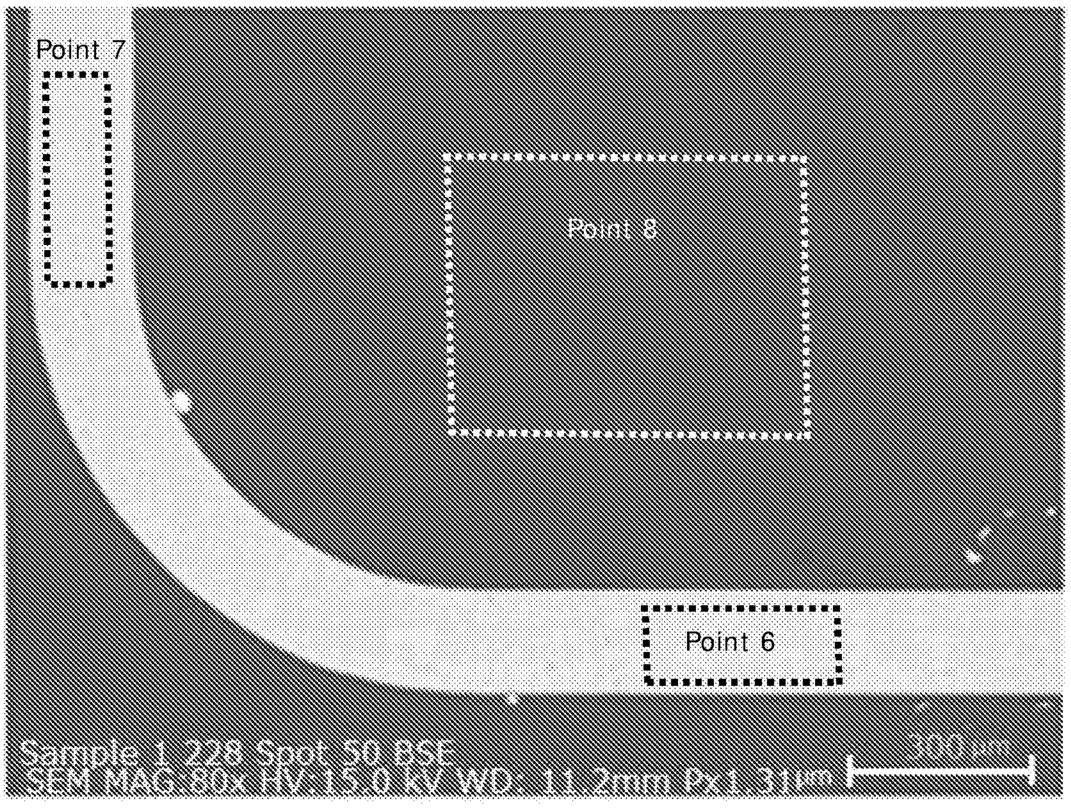
FIG. 7 illustrates EDX analysis of bond frame—(a) before cavity etching and (b) after cavity wet etching.
Figure 7B:
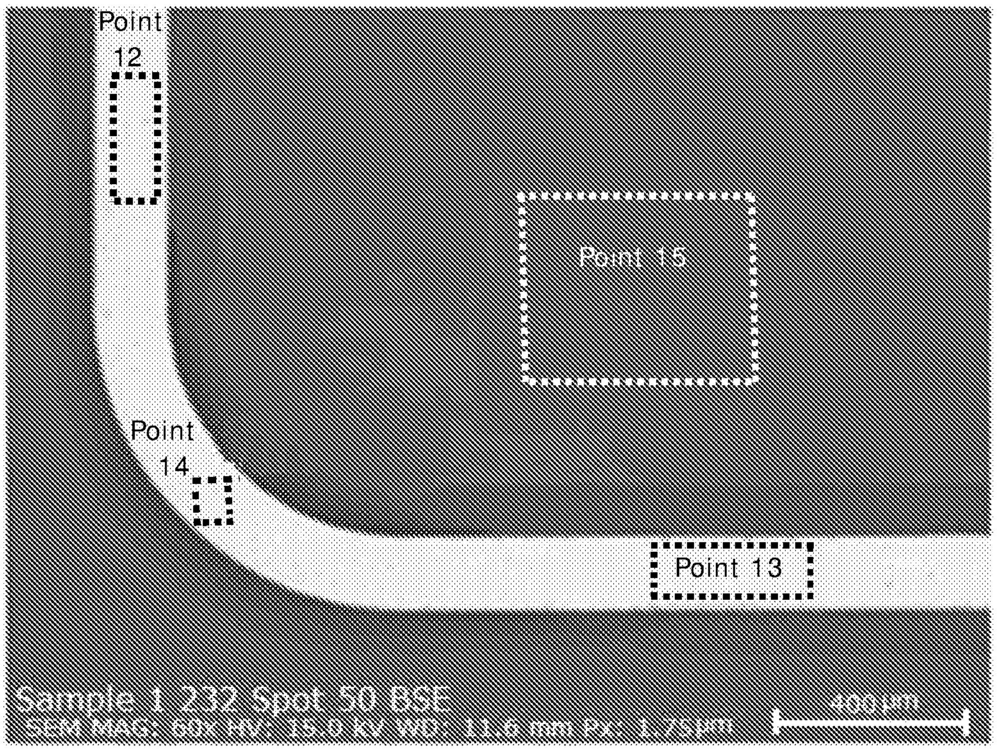

Results of EDX analysis before and after cavity wet etching are shown in FIG. 7. The reduction in the atomic percentage of Sn after the cavity etching is insignificant. Therefore, Sn can also be used as a mask while cavity is formed on the Si bulk by wet etching.

SLID Bonding of the Chip or Wafer Stack

Our process demonstrates that Sn can be used as a mask for Si micromachining by both wet and dry etching approaches. In our demonstration, Sn is used as the bond frame metal layer for Cu—Sn SLID bonding. By using Sn as mask for the Si cavity etching, several processing steps involving photolithography are avoided. This makes the fabrication of cap wafers for the SLID bonding simpler while saving time and cost.

To summarize the present invention thus relates to a method for micromachining a silicon structure especially for SLID bonding. The method comprises the steps of preparing a silicon wafer with a metal pattern on said silicon where the silicon is exposed outside the pattern. The metal pattern at least being constituted by an upper surface consisting of Sn and the method comprises a step of DRIE etching of the structure for etching cavities in said exposed silicon wafer essentially without etching said Sn top layer.

A metal layer (USM) may be provided as an adhesion layer said silicon wafer surface, being constituted by Si or SiO and the metal pattern. The method then including an initial step before said DRIE etching, said performing a wet etching removing said USM layer outside thus exposing said silicon outside said metal pattern, the USM metal being at least one of Au and TiW.

The DRIE etching will preferably include reactive ion etching with CHF3 being the primary driving gas and the wet etching process may preferably be based on a 10% KOH at 80° C.

The metal pattern may be constituted by a Sn layer stacked on top of at least one of Cu, Au, Ag, Ni or Cu—Ni, constituting a SLID metal pattern suitable for SLID bonding process, and preferably a Cu layer with an upper Sn layer. In this case the SLID bonding may be constituted by bonding a corresponding Cu—Sn pattern on said metal pattern providing a Cu—Sn SLID bonding, with a resulting Cu3Sn layer between the Cu layers.

According another aspect the present invention relates to a Sn metal pattern on a silicon wafer being used as an etching mask during an etching process including a DRIE etch process.

According yet another aspect the present invention relates the use of a Sn metal pattern on a silicon wafer wherein the wafer is covered with a USM metal layer, where the Sn metal layer is used as an etching mask during an etching process including a wet etch process, the USM metal being at least one of Au or TiW metal.

REFERENCES

1. Lapadatu, A.; Simonsen, T. I.; Kittilsland, G.; Stark, B.; Hoivik, N.; Dalsrud, V.; Salomonsen, G. Cu—Sn Wafer Level Bonding for Vacuum Encapsulation of Microbolometer Focal Plane Arrays. *ECS Trans.* 2010, 33, 73-82.
2. Luu, T.-T.; Hoivik, N.; Wang, K.; Aasmundtveit, K. E.; Vardøy, A.-S. B. High-Temperature Mechanical Integrity of Cu—Sn SLID Wafer-Level Bonds. *Metall. Mater. Trans. A* 2015, 46, 5266-5274.
3. Xu, H.; Suni, T.; Vuorinen, V.; Li, J.; Heikkinen, H.; Monnoyer, P.; Paulasto-Kröckel, M. Wafer-level SLID bonding for MEMS encapsulation. *Adv. Manuf.* 2013, 1, 226-235.

4. Larsson, A.; Tollefsen, T. A.; Aasmundtveit, K. E. Ni—Sn solid liquid interdiffusion (SLID) bonding—Process, bond characteristics and strength. In Proceedings of the 2016 6th Electronic System-Integration Technology Conference (ESTC); 2016; pp. 1-6.
5. Aasmundtveit, K. E.; Tollefsen, T. A.; Luu, T.; Duan, A.; Wang, K.; Hoivik, N. Solid-Liquid Interdiffusion (SLID) bonding—Intermetallic bonding for high temperature applications. In Proceedings of the 2013 European Microelectronics Packaging Conference (EMPC); 2013; pp. 1-6.
6. Laurila, T.; Vuorinen, V.; Kivilahti, J. K. Interfacial reactions between lead-free solders and common base materials. *Mater. Sci. Eng. R Reports* 2005, 49, 1-60.
7. Hilton, A.; Temple, D.; Lannon, J.; Schimert, T.; Skidmore, G.; Gooch, R.; Trujillo, C.; Miskimins, S.; Li, C. Wafer-level vacuum packaging of microbolometer-based infrared imagers. In Proceedings of the Proceedings of the International Wafer-Level Packaging Conference, San Jose, CA, USA; 2016.
8. Wang, X.; Bleiker, S. J.; Edinger, P.; Errando-Herranz, C.; Roxhed, N.; Stemme, G.; Gylfason, K. B.; Niklaus, F. Wafer-Level Vacuum Sealing by Transfer Bonding of Silicon Caps for Small Footprint and Ultra-Thin MEMS Packages. *J. Microelectromechanical Syst.* 2019, 28, 460-471.
9. US2017225947
10. US2021202249
11. KR20160146126

The invention claimed is:

1. A method for micromachining a silicon structure, comprising:

preparing a silicon wafer with a metal pattern on the silicon, the silicon being exposed outside the metal pattern, the metal pattern at least having an upper surface consisting of Sn;

Deep Reactive Ion etching ("DRIE") of the structure for etching cavities in the exposed silicon wafer essentially without etching the Sn top layer;

wherein an under seal metal ("USM") layer has been provided between the silicon wafer and the metal pattern; and before the DRIE, performing a wet etching removing the USM layer outside thus exposing the silicon outside the metal pattern, metal of the USM layer being at least one of Au and TiW.

2. The method according to claim 1, wherein the DRIE includes reactive ion etching with $CHF_3$ being the primary driving gas.

3. The method according to claim 2, wherein the wet etching process is based on a 10% KOH at 80° C.

4. The method according to claim 1, wherein the metal pattern is constituted by a Sn layer stacked on top of at least one of Cu, Au, Ag, Ni or Cu—Ni, comprising a Solid-Liquid-InterDiffusion ("SLID") metal pattern suitable for a SLID bonding process.

5. The method according to claim 1, wherein the metal patterns comprise a Cu layer and an Sn layer.

6. The method according to claim 1, wherein the SLID bonding comprises bonding a corresponding Cu—Sn pattern on the metal pattern providing a Cu—Sn SLID bonding, with a resulting $Cu_3Sn$ layer between the Cu layers.

7. The method according to claim 1, comprising using the Sn metal pattern on a silicon wafer as an etching mask during an etching process including the DRIE.

8. The method according to claim 1, comprising using the Sn metal pattern on a silicon wafer, wherein the wafer is covered with the USM layer, the Sn metal layer being used as an etching mask during an etching process including the wet etch process, the USM metal being at least one of Au or TiW metal.

* * * * *